US006313992B1

(12) United States Patent
Hildebrandt (10) Patent No.: US 6,313,992 B1
(45) Date of Patent: Nov. 6, 2001

(54) METHOD AND APPARATUS FOR INCREASING THE POWER DENSITY OF INTEGRATED CIRCUIT BOARDS AND THEIR COMPONENTS

(75) Inventor: James J. Hildebrandt, 17836 Oak St., Fountain Valley, CA (US) 92708

(73) Assignee: James J. Hildebrandt, Costa Mesa, CA (US)

(*) Notice: Subject to any disclaimer, the term of this patent is extended or adjusted under 35 U.S.C. 154(b) by 0 days.

(21) Appl. No.: 09/465,428

(22) Filed: Dec. 21, 1999

Related U.S. Application Data
(60) Provisional application No. 60/113,332, filed on Dec. 22, 1998.

(51) Int. Cl.[7] .................................................... H05K 7/20
(52) U.S. Cl. ........................... 361/700; 361/688; 361/714; 257/714; 165/104.34
(58) Field of Search .................................... 361/663, 687, 361/698–704, 717–723, 749, 707, 690, 713; 174/24, 94 R, 94 S, 74 R; 439/883, 884, 889; 336/198; 29/860, 861; 165/80.6, 908, 80.3, 104.33, 104.32, 104.34; 257/706–727; 62/304, 314, 315, 316; 438/122

(56) References Cited

U.S. PATENT DOCUMENTS

| | | |
|---|---|---|
| 3,746,947 | 7/1973 | Yamamoto et al. . |
| 3,971,435 * | 7/1976 | Peck ........................................ 165/78 |
| 4,392,153 | 7/1983 | Glascock, II et al. . |
| 4,549,407 * | 10/1985 | Gruber .................................... 62/304 |
| 4,573,067 | 2/1986 | Tuckerman et al. . |
| 4,912,548 * | 3/1990 | Shanker et al. ......................... 357/82 |
| 5,049,973 | 9/1991 | Satriano et al. . |
| 5,239,200 | 8/1993 | Messina et al. . |
| 5,345,107 | 9/1994 | Daikoku et al. . |
| 5,349,131 * | 9/1994 | Sotani et al. ........................... 174/24 |
| 5,373,417 | 12/1994 | Barrett . |
| 5,453,911 * | 9/1995 | Wolgemuth et al. ................. 361/689 |
| 5,685,361 * | 11/1997 | Demmler et al. ....................... 165/41 |
| 5,719,444 | 2/1998 | Tilton et al. . |
| 5,777,384 * | 7/1998 | Root et al. ............................. 257/712 |
| 5,818,692 * | 10/1998 | Denney et al. ....................... 361/699 |
| 5,880,931 | 3/1999 | Tilton et al. . |
| 5,998,240 * | 12/1999 | Hamilton et al. ..................... 438/122 |

FOREIGN PATENT DOCUMENTS

| | | | |
|---|---|---|---|
| 360136350A * | 7/1985 | (JP) | ................................ H01L/23/44 |
| 401251646A * | 10/1989 | (JP) | ................................ H01L/23/34 |
| WO 98/46058 | 10/1998 | (WO) . | |

OTHER PUBLICATIONS

IBM Technical Disclosure Bulletin, Jul. 1983, US. vol. 26, p. 841.*

IBM Technical Disclosure Bulletin, Jul. 1976, US. vol. 19, pp. 705–706.*

* cited by examiner

*Primary Examiner*—Leo P. Picard
*Assistant Examiner*—Michael Datskovsky
(74) *Attorney, Agent, or Firm*—Stanley A. Becker (57) ABSTRACT

Apparatus and methods for cooling integrated circuit boards and electronic components by providing internal passageways in the components and circuit boards which connect to a fluid manifold. The internal passageways connect to a plurality of other passageways so that fluid can be applied to the surface of the components. A cooling fluid capable of phase change is supplied to the internal passageways to conductively cool the interior of the component and to flow through the other passageways to cool the surface of the component at least partially by evaporative cooling. A plurality of circuit boards can be placed back to back with the fluid manifold therebetween, both of which are in an enclosed space so that cooling fluid can be supplied through the fluid manifold to the integrated circuit boards and to the individual components for cooling both the circuit boards and the electronic components.

26 Claims, 6 Drawing Sheets

METHOD AND APPARATUS FOR INCREASING THE POWER DENSITY OF INTEGRATED CIRCUIT BOARDS AND THEIR COMPONENTS

This application claims benefit of provisional application Ser. No. 60/113,332 filed Dec. 22, 1998.

BACKGROUND OF THE INVENTION

1. Field of the Invention

This invention relates generally to the cooling of integrated circuit boards and power electronic components to increase their power density. Most electrically energized equipment is limited in its capacity by thermal constraints. The advent of more electric vehicles such as ships, transportation equipment including cars, trucks, aircraft and trains has pushed the capabilities of many electronic controls to their maximum thermal constraints. These constraints have a direct effect on efficiency, power density, packaging and the architectural configuration for these components in their operating environments.

Each year additional software and hardware is required by electronic systems in order to meet customer expectations, particularly in power electronics. Increasingly there are many applications where significantly higher power is required and space is at a premium. Efficiency and power density may be compromised by the addition of more cumbersome traditional integrated circuit cooling systems utilizing, cold plates and traditional spray cooling methods. There are many applications where this is not a significant issue, however, there are an increasing number of environments, such as with power electronics where power density must be optimized to enable such applications to be commercialized.

One such example is the current interest in the introduction of hybrid/electric propulsion systems in transportation. Power density is a critical factor in determining overall fuel efficiency of the platform. It is critical to reduce an electrical component's size to achieve lightweight, cost-effective components.

The present invention relates to a significantly more effective method and apparatus for the removal of latent heat from integrated circuit boards, integral power busses and their components. It has been found that a significant increase in power density is achieved by utilizing the integrated circuit board and/or their components as the injection source in the spray cooling process. By utilizing the integrated circuit boards and their components two significant factors are accomplished. In the first, the heat is more effectively removed directly from the source of the heat generated. This helps to eliminate any unnecessary high and low pressure regions integral to the environment in which the components are encased. The second factor is the elimination of additional manifolds and injectors to nebulize liquids which add to a system's complexity, requires more space, adds additional cost and increases the relative amount of maintenance.

2. Description of Related Art

U.S. Pat. No. 5,719,444 discloses a packaging and cooling system for one or more semi-conductor devices in which an evaporative type liquid coolant is sprayed from a plurality of spray nozzles onto the semi-conductor devices and the liquid is then condensed, cooled and recirculated by a pump to an input plenum for reuse in a closed circuit.

U.S. Pat. No. 5,880,931 discloses a spray cooled circuit card cage which includes a manifold to provide coolant fluid to a plurality of spray plate assemblies which direct the spray of coolant over the top surface of the electronic cards within the card cage.

U.S. Pat. No. 4,392,153 discloses a semi-conductor electronic device which is attached to fluid cooled heat sinks to provide efficient removal of heat generated by the device, U.S. Pat. No. 4,573,067 discloses a semi-conductor chip which is provided with fins to provide improved heat dissipation capability.

U.S. Pat. No. 5,239,200 discloses a heat transfer module which is placed into thermal contact with a chip on a circuit board for conducting heat therefrom. The heat transfer module has a channel therein for receiving a coolant.

U.S. Pat. No. 5,345,107 discloses a cooling apparatus for an electronic device in which a cooling body is placed into surface contact with an electronic device.

U.S. Pat. No. 5,049,973 discloses a heat sink for electrical components.

U.S. Pat. No. 5,373,417 discloses a liquid cooled circuit package where the package is filled with a cooling liquid during operation.

U.S. Pat. No. 3,746,947 discloses a semi-conductor device which is positioned with a enclosure which has liquid coolant circulating therein.

None of the foregoing prior art suggested ports, perforations or passageways in either the circuit board, the components themselves, or the conductive leads for the components to promote internal cooling of the components by conduction, and cooling of the surface of the components by evaporative and conductive cooling.

SUMMARY OF THE INVENTION

The present invention provides a method and apparatus for addressing a significant obstacle in increasing power density of integrated circuit boards and their components during the spray cooling process. Substantial inefficiencies occur in traditional designs which attempt to remove heat from energized circuit board components via external sources. These external sources, utilized in the spray cooling process, are typically in the form of nozzles or injectors placed adjacent to a board in the proximity of the energized components. The present invention utilizes the integrated circuit board and/or its components as the source for delivering fluids directly through internal intake and exhaust ports and thus, provides a more efficient system which directs beat directly away from energized components effectively towards its cooling source within the spray cooled system.

More traditional designs have to overcome a multitude of obstacles. These obstacles are a result of trying to direct coolants towards, as opposed to away from, the energized components on an adjacent integrated circuit board. This results in unnecessary increased boundary layers and vortices during phase change. This is due to vapors having to escape the area where the fluid vaporizes directly in opposition of the spray pattern during the cooling process which creates ineffective heat removal in this process. It should be emphasized that this invention may provide for some of its coolants to reach the adjacent board in liquid form, however, significant advantages are accomplished by using the integrated circuit board for the placement of some injection nozzles; The net effect is increased power density.

Thermal instabilities can create mechanical fatigue over time particularly, in high power density applications where temperatures may vary significantly from one location in a component as compared to another. This is becoming a common occurrence in cold plate cooling creating separations or fractures and is avoided in the utilization of the subject invention. The core of a component maintains a more consistent temperature as the outer surface while employing the principles of this invention. On a micro-prospective, dissimilar temperatures also inhibit the free passage of electrons which is ultimately a function of increased resistance and effects the overall efficiency and equilibrium in an integrated circuit board and its components. Thermal inconsistencies and mechanical instabilities may also result in increased audible/radiated and electrical noise in addition to fatigue.

The present invention can be carried out in a manner where a continuous supply of liquid coolants are provided to an integrated circuit board or a pair of boards set back-to-back where sufficient space is provided between the boards to provide an inlet chamber for the introduction of coolants. The peripheral edges of these boards are joined and sealed creating a void or chamber within a sandwich like enclosure to allow the two boards to act as an intake manifold for liquid coolants. Alternatively, a manifold could be attached to the bottom of a single integrated circuit board utilizing the board to provide an enclosed fluid chamber or to a single component such as a transformer. Boards may be dielectrically isolated or conductivly connected to one another through the surrounding attachments making up the enclosure. The choice would depend if each board has similar or dissimilar power requirements. If power requirements are dissimilar, the boards must be dielectrically isolated or have an appropriate stepper. Power supplies, microprocessors, SCR's, IGBT's, voltage steppers, inverters, rectifiers, surge capacitors, batteries, or regulators may be strategically placed on these surfaces between two similar, dissimilar boards or individually mounted to a manifold.

This inlet chamber or intake manifold between the boards enables the introduction of the liquid through openings in components mounted thereto and/or through openings in the board itself past these components to accelerate vapor removal. If desired, a nozzle or nozzles could be connected to perforations in the board to direct cooling fluid onto specific components. Regulation of the openings is managed by the size and placement of perforations or inlets relative to cooling requirements in the systems architecture. Generally, the closer a component is to an inlet, the smaller the hole is required to provide adequate pressure to that component. Conversely, the further a component is located from the inlet, the larger the hole is necessary to maintain adequate pressure. This design mimics a biological capillary design. It provides for better interaction of the liquid, electron and gas exchange allowing for the board to act is a membrane like our skin thus, more closely mimicking a biological system such as that found in the human body.

Yet, another way to visualize this micro-port configuration, from a turbulence perspective, is to more closely emulate the design of a feather. This design also helps to evacuate vapor directing it towards the cooling source. This is a result of continually homogenizing respectively large vortices and reducing their size and increasing acceleration when the gas stream approaches the vapor exit of the chamber and exits to the cooling source. The cooling source in some cases may still be the enclosure itself of these components. The placement of high heat components such as power supplies or magnetics near the inlet side of the board may also help the natural acceleration of vapor to the cooling source. This design also helps to evacuate vapor directing it towards the cooling source.

This results in a reduction of unnecessary vortices. The placement of high heat components such as SCR's and IGBT's or transformers near the inlet side of the board may also help the natural acceleration of vapor to the cooling source. This configuration allows the mounting of components on both sides of what becomes a single integrated circuit board with an internal fluid filled chamber. The liquid can be directed away from an integrated circuit board effectively in any direction in this configuration It is therefore an object of the present invention to provide methods and apparatus for increasing the effectiveness of the spray cooling for integrated circuit boards and their components.

It is an additional object of the invention to provide for effectively cooling the conductive source and the integrated circuit board from within and on the surface. This increases the overall carrying capacity of the conductive infrastructure, including the buss, by providing a more uniform temperature with a simple more unified transition of heat removal.

It is still an additional object of this present invention to improve the power density of the components attached to and utilized as an integral part of this injection manifold where the components themselves contain internal passages and perforations thus, rendering them all into part of this fully integrated injection and nebulizing system.

The aforementioned objects and advantages of the present invention, as well as additional objects and advantages thereof, will be more fully understood from the following detailed description of the preferred embodiments when taken in conjunction with the following drawings. It should be understood, however, that the detailed description and the specific examples while representing the preferred embodiments are given by way of illustration only.

DETAILED DESCRIPTION OF PREFERRED EMBODIMENTS

The following description is of the best presently contemplated modes of carrying out the inventions. This description is made for the purpose of illustrating the general principles of the invention and should not be taken in a limiting sense.

Figure 1:
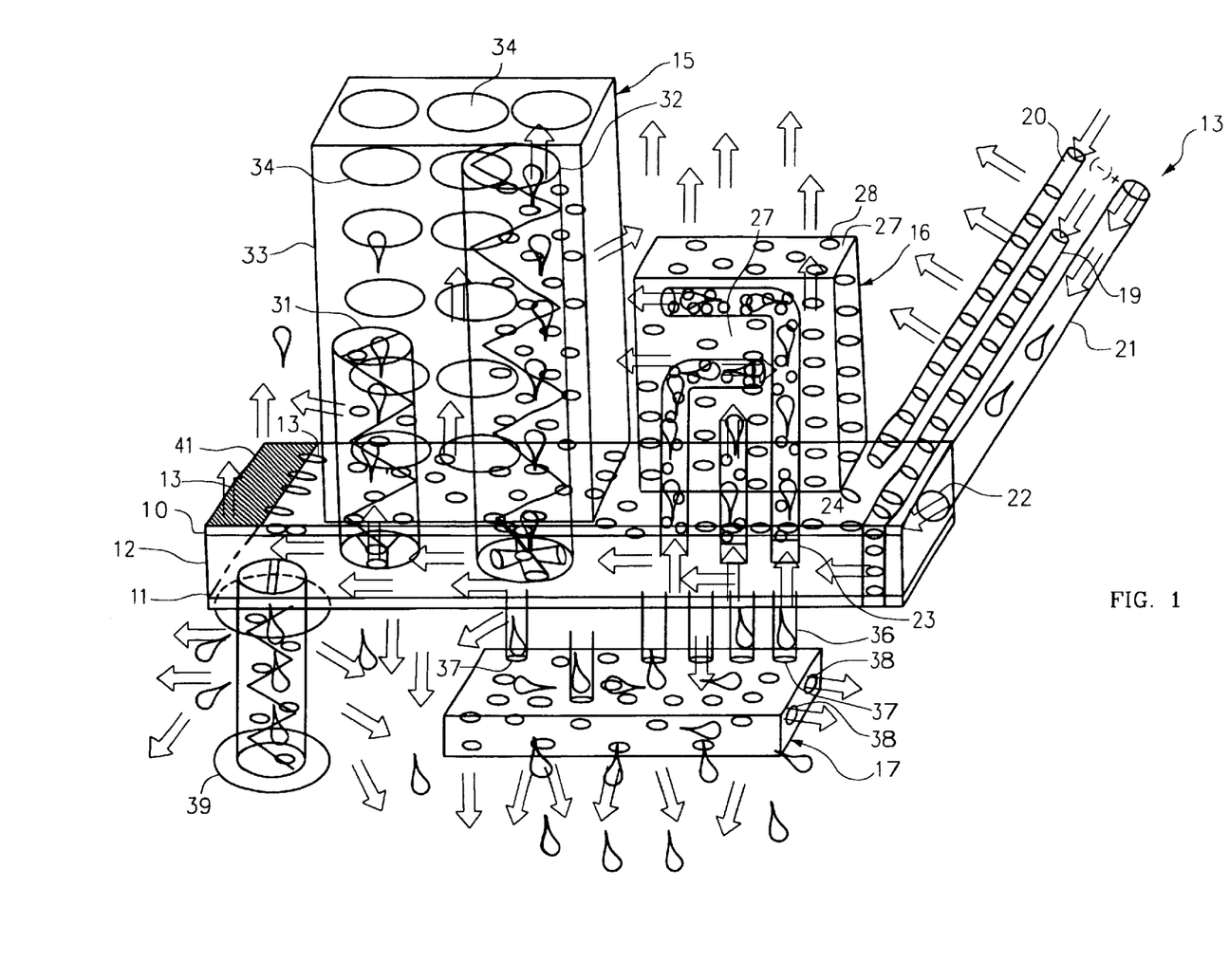
FIG. 1 is a perspective view of two integrated circuit boards and their components illustrating the boards and components acting as a fully integrated manifold injection system in accordance with the principals of the invention.

In accordance with the present invention, there is shown in FIG. 1 a first integrated circuit board 10 spaced from a second integrated circuit board 11 to form an enclosed inlet chamber or injection manifold 12 therebetween for cooling fluids. A plurality of openings 13 are provided in the first and second integrated circuit boards 10 and 11 to allow cooling fluids to exit from the manifold 12 to cool the components such as 15, 16 and 17 on the circuit boards. inlet port 18 and positive and negative buss bars 19 and 20 deliver fluids to the manifold 12 as well as electrical power to the boards 10 and 11. Bars 19 and 20 may also act as overflow outlets allowing excess fluid to return to a reservoir (not shown) if the porting is such that it allows it to do so. A conduit 21 communicates with an inlet port 22 on one end of the internal manifold 12 for fluid delivery. A similar port may be utilized for the buss bars 19 and 20. An electrical component 16 such as a transistor, silicone rectifier or IGBT may have one or more hollow conductor leads or legs 23 which have a plurality of passageways or perforations 24 allowing for introduction of fluid into and through the conductive, semi conductive or dielectric substrates 27 which are also perforated at 28 providing exit ports for fluid and/or vapor into a surrounding environmental chamber. Transformer coils 31 and 32 are shown attached to the integrated circuit board manifold 12 in the same manner. A secondary mesh housing 33 may also have a plurality of perforations 34 if such a housing is desirable. This secondary mesh housing 33 provides for containment of the cooling mist and a more uniform exit of vapor during the vaporization process.

Figure 5:
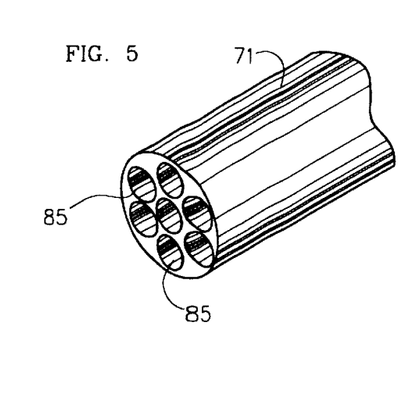
FIG. 5 is an enlarged cross section of a conductor leg taken along line 5—5 of FIG. 4.

A microprocessor 17 may be attached to one or both of the boards 10 or 11 in the same manner with hollow conductive leads 36 having a plurality of passageways therethrough as shown in FIG. 5 communicating with internal passageways 37 in the microprocessor 17. The internal passageways 37 connect to a plurality of exit ports 38 through the microprocessor which allow fluid to contact the surface of the microprocessor. There are a multitude of porting technologies available capable of providing axial, radial or other passages within these electrical components. Ultimately, creative engineering will enable these materials to become the most porous and exhibit a membrane like emulation. There are also materials readily available, such as conductive or non-conductive mesh which are suitable and were utilized in the construction of the coil exhibited herein. Similarly a capacitor 39 or other components may be attached to the boards 11 and 13 in the same manner as described above.

One or more very fine conductive or non-conductive meshes 41 may be secured to the top or bottom or center of each board 10 or 11 to enhance or enable atomization of the cooling liquids exiting to the environmental chamber.

The integrated circuit board manifold 12 may include injectors or atomizers affixed or connected to the manifold for spraying selected electrical components. A plurality of integrated circuit boards may be arranged to use a common manifold. The apparatus of the subject system may include generally utilized components such as radiators, inter coolers or compressors, as well as filters, pumps and regulators, which are not shown but are generally known within the art. Further, the apparatus may include a bi-directional inlet/outlet conduit 21 from which fluid can be delivered to and taken from a board without perforating the board for pressure regulation. Further, the apparatus may include an overflow outlet, such as a port in the manifold 12 which allows excess liquid to drain into the enclosure or a reservoir.

The individual internally injected components, or a board with multiple internally injected components as described above, would be located within some type of sealed enclosure. This enclosure provides for a sealed environment onto which the manifold is secured and wherein the vapor and/or fluid can be collected and recycled. Boards or components may be stacked in series or the enclosure may contain one component affixed to an intake manifold. Depending on the power density required, the enclosure may provide an adequate cooling medium to condense the fluid particulate if it is located in a cold environment. If necessary, the enclosure becomes an environment with appropriate ports which directs the vapor to a radiator, intercooler, compressor, heat pipe or other cooling apparatus known to those skilled in the art.

Figure 2:
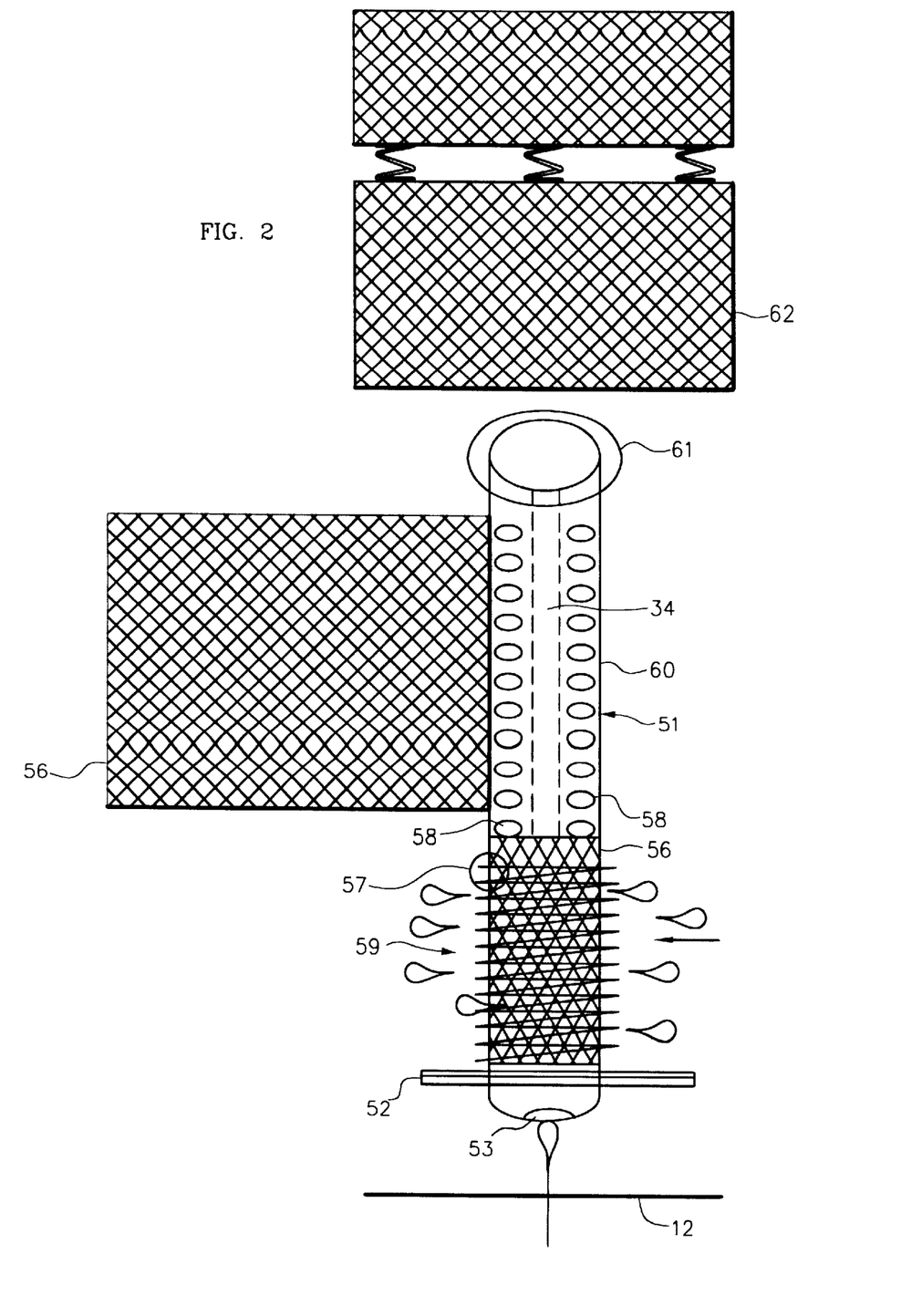
FIG. 2 is an enlarged representation of a coil modified and cooled in accordance with the subject invention.

Referring to FIG. 2, there is shown an example of a fully perforated component such as an internally injected coil 51 specifically designed to propagate vaporization and act as an injector when mounted to an integrated circuit board manifold. The base of the coil's core 52 serves as a mounting point for the coil. The intake port 53 of the coil 51 connects the coil 51 to the manifold 12 at its base. An internal passage 54 for the fluid within the coil 51 communicates with passageways, perforations or openings 58 in the core on which the coil 51 is wound. A conductive mesh 56 is illustrated with part of it wrapped around the coil 51 and part of it unwrapped. The mesh 56 induces atomization of the fluids through the energized components through the windings 57 of the energized coil. Exit ports 58 are shown as part of the coil 51 The coil winding mesh matrix is shown assembled at 59. End caps 61 on each end secure the mesh matrix 59 to the core 60 of the coil 51. A secondary cylindrical mesh enclosure 62 may be placed over the coil 51 to provide additional containment of the cooling mist. Preferably, the enclosure 62 is spaced a predetermined distance from the mesh 59 to provide the highest efficiency. This may vary from component to component.

Figure 3:
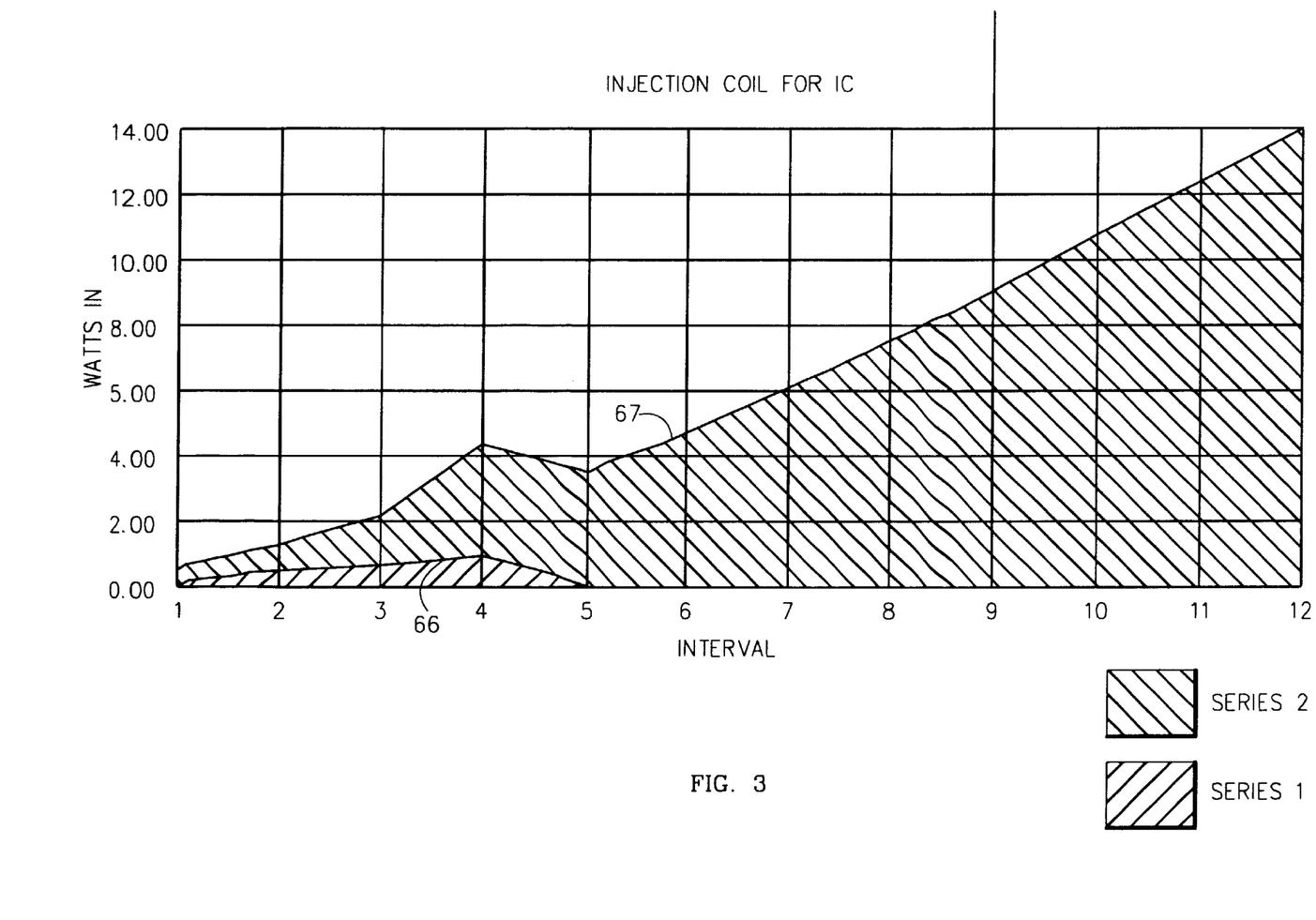
FIG. 3 is a graph of an injector coil for an integrated circuit illustrating the significant increases in power density that are possible when the coil is modified and cooled in accordance with the subject invention.

FIG. 3 illustrates the advantageous results derived from the present invention. This graph illustrates the significant increases in power density possible when power is delivered to a coil utilizing the principles of this invention. The first curve 66 identified as Series 1 shows the power density of the coil in a traditional manner of use. The second curve 67 identified as Series 2 indicates that a 16 times increase in power density is achieved when the coil is cooled in accordance with the principles of this invention. A minimum of a 32x increase is anticipated by increasing the flow rate and/or boiling point of the fluid. The life of the coil was also extended by 3.5 times while achieving this increase in power density. Liquid halogenated hydrocarbons, such as fluorocarbons, capable of phase change were utilized as the cooling fluid in this particular test. Perfluorocarbons, such as Flourinert made by 3M, are a preferred cooling liquid which is capable of phase change. Any such liquid may be utilized so long as it is compatible with the materials into which they are introduced.

It is to be understood that a key aspect of the present invention resides in the continuous introduction of a cooling liquid capable of phase change. A continuous flow of these liquids through the integrated circuit board manifold and/or their components provides for a more effective way to remove the heat directly from the energized electric components when compared to traditional methods and apparatus. In addition, the present invention may reduce electric interference in certain frequencies, thereby reducing or eliminating noise interferences such as EMI and EMC, both internal and external to the system.

To achieve maximum efficiency of the internally injected cooling process the fluid should begin to vaporize near the surface of the component. This ensures that the fluid has been adequately saturated with heat and maximum cooling efficiencies have occurred. This will occur near or at its boiling point and will allow for conductive cooling to occur at or near the core of any given component. For example, if the components highest temperature occurs towards or at the core, then atomization or propagation of the minute droplets should be initiated via the design of the component. If the highest heat is near or at the surface of the component than conductive cooling in the core is suitable With atomization instilled near the surface. If there are varying degrees of heat the utilization of convection and atomization can be combined at different locations to maintain a homogenous temperature. This method is maintained though adequate porting within the component and could require some spray cooling from an external source if necessary. This can be achieved by matching flow rate and porting to achieve the best results.

It should be noted that this port/flow rate matching should consider the highest possible temperature anticipated for any given component. The maximum operating capacity will yield thermally saturated fluid, initiating phase change, at or near the surface of an energized component at full load. If the component operates at variable loads the system will provide conductive cooling i.e.; without phase change during operation below its peak rating.

Micro machining for porting processes and atomization initiation processes capable of creating atomization membranes are well known to those skilled in the art and include, EDP, CNC, laser cutting or etching methodology. The coil demonstrated in this art combined EDP and mesh technology as well as the use of increased surface area on the coil tube itself. It is anticipated that, for example, in the case of high power capacitor and microprocessors cooling, thin films, masking, vapor deposition, chemical etching techniques and layering could provide for excellent ways to create multiple matrix porting which become in effect membranes between or through conductive, semiconductive or dielectric materials. This technique will homogenize molecules and create thermal distribution of the cooling medium. This effect will maximize thermal saturation and yield vapor in the most effective and efficient manner. Again, conductive and phase change will occur at varying points to maximize cooling based on porting. The more effective the membrane for atomization and heat transfer the higher the power density becomes.

The following test data illustrates the principles of this invention. The tests were The performed to measure the baseline for power density increases in electromagnetic coils. The test data compares an air cool coil to a fluid injected coil which is cooled in accordance with the principles of this invention. The air cooled coil was a hand wound DC coil using copper wire with a dielectric coating. The core was galvanized iron pipe which had a diameter of 0.375 inches. The wire was 0.0155 inches in diameter. The pipe was four inches in length. The 4 inch long pipe had a hollow core through the center. A very fine single layer brass wire mesh was wrapped on the outside of the wound coil. Both ends of the coil were capped with a washer and a nut on each end. A thermistor was wound into the windings to indicate temperature.

The fluid injected coil was made the same as above, but the core was drilled with 16 evenly spaced holes of 0.040 inches diameter. The holes drilled in the core provided improved atomization. The tops of the holes were also scribed with a semi elliptical groove to help initiate atomization. There were two grooves 180 degrees apart and shaped like a crescent moon. A single layer of very fine brass wire mesh was wrapped about the windings. The wire mesh was epoxied along the ends in a manner so that it did not constrict the flow of fluids. From the core outwardly the holes were drilled in the core to inject and disperse the fluid evenly to the windings. A thermistor was wound into the windings to indicate temperature.

Digital meters monitored amperage, voltage and temperature of the coil during operation. An inline filter capable of removing particulates of 20–50 microns or smaller was utilized in the cooling inlet to the fluid injected coil.

In the test for the fluid injected coil, a coil was placed in a condensation/vapor chamber which sufficiently sealed it to the air. A 5.5 inch stainless steel bowl was placed on top of the chamber to provide some additional heat exchange in addition to the outside surface of the chamber. Several ice cubes were placed in this bowl which bad a surface area of 4 to 5 square inches for additionally cooled heat exchange via 35F+/−surface area to condensing chamber. A small pump was utilized to disperse the cooling fluid, Flourinert, at low volume to the inlet to the coil in the fluid injected coil test with tubing connecting the pump to the coil, filter and chamber drain back to the reservoir. An AC rectified to DC controller 0 to 90 volts provided the power to the coil.

In the test, each coil was run at 3 volts and increased by 2 volts every 2 minutes. At each voltage setting and subsequent time interval the readings were recorded. The following results were recorded:

| READING | TIME | TEMP | WATTS |
|---|---|---|---|
| | AIR COOLED COIL | | |
| 1 | 1 | 82 | 0.135 |
| 2 | 2 | 105 | 0.355 |
| 3 | 4 | 161 | 0.602 |
| 4 | 6 | 254 | 0.855 |
| 5 | 7.15 | 287 | 0 |
| 6 | | | 0 |
| 7 | | | 0 |
| 8 | | | 0 |
| 9 | | | 0 |
| 10 | | | 0 |
| 11 | | | 0 |
| 12 | | | 0 |
| 13 | | | 0 |
| 14 | | | 0 |
| | FLUID INJECTED COIL | | |
| 1 | 1 | 69 | 0.28 |
| 2 | 2 | 72 | 0.77 |
| 3 | 4 | 75 | 1.48 |
| 4 | 6 | 82 | 2.42 |
| 5 | 8 | 95 | 3.45 |
| 6 | 10 | 102 | 3.40 |
| 7 | 12 | 114 | 4.59 |
| 8 | 14 | 123 | 6.00 |
| 9 | 16 | 136 | 7.37 |
| 10 | 18 | 147 | 9.04 |
| 11 | 20 | 159 | 10.73 |
| 12 | 22 | 179 | 12.16 |
| 13 | 24 | 195 | 13.70 |
| 14 | 26.75 | | |

Temp F. 73
Dewpoint 60%
Relative Humidity 62%
Barometric Pressure 29.92

As shown above, the air cooled coil failed at 7 minutes 9 seconds while the fluid injected coil lasted 26 minutes 45 seconds. The fluid injected coil provided an increased life in excess of 3.5 times that of the air cooled coil given an increase in power every two minutes in both tests. Also, at the same time, the fluid injection cooled coil was able to increase its total power imput to 13.7 watts as compared to the air cooled coil at 0.855 watts. Thus, the fluid injected coil increased its power carrying capacity 16 times as compared to the air cooled coil. Again, at least a 32× increase is anticipated with a larger intercooler and or higher boiling fluid.

Figure 4:
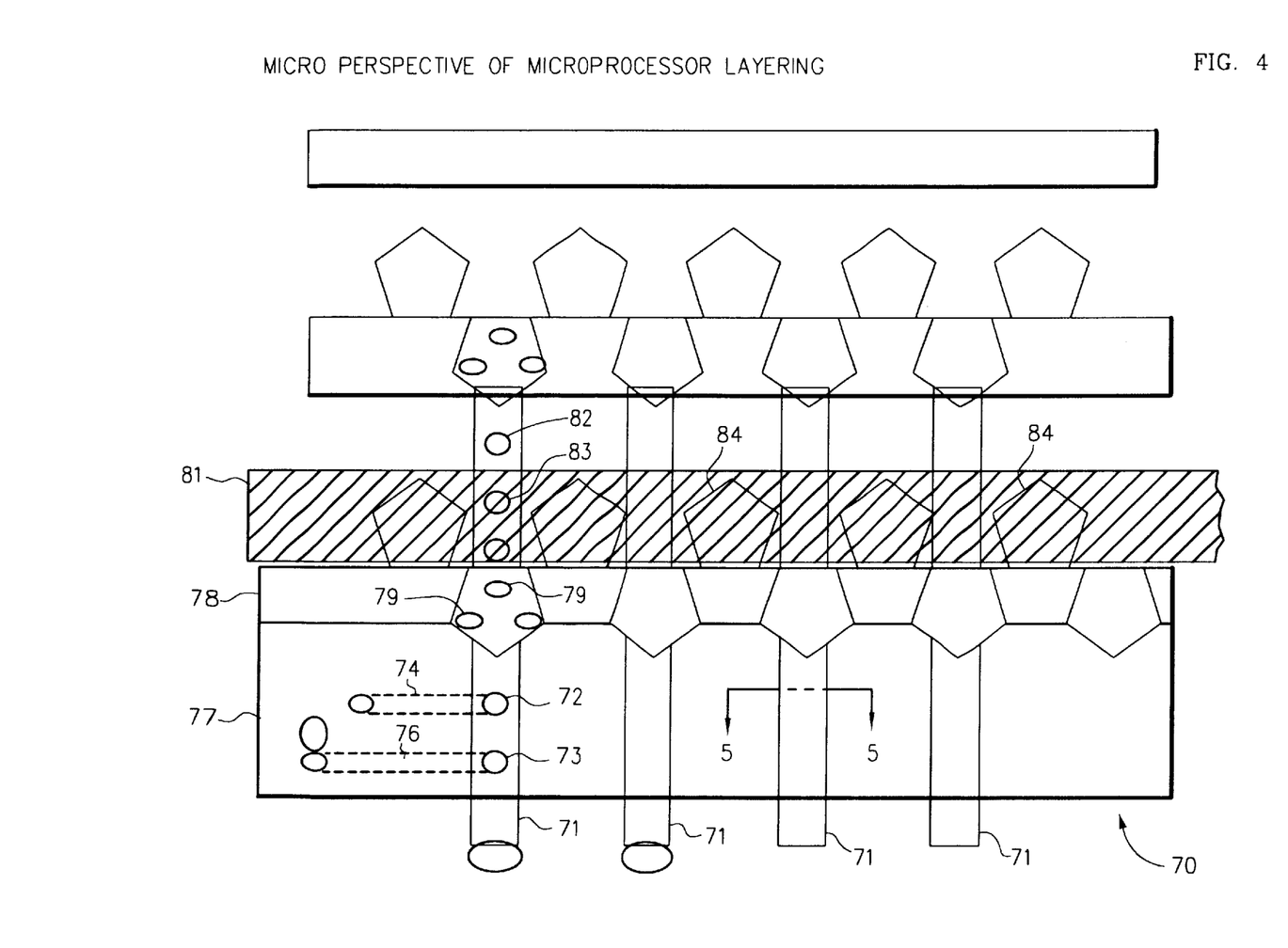
FIG. 4 is an enlarged representation of a micro processor modified and cooled in accordance with the subject invention.

Referring to FIG. 4, there is shown a cross sectional view of a microprocessor generally designated as 70 which rests on an intake manifold (not shown) similar to the one described with respect to FIG. 1. A plurality of perforated hollow conductor legs 71 are in communication with openings to the fluid manifold. The conductor legs are perforated at various intervals as shown at 72 and 73. These openings 72 and 73 are in communication with passages 74 and 76 in the substrate portion 77 of the microprocessor. The microprocessor has a semi conductor material layer 78 which is also in communication with the fluid from the fluid manifold via openings 79. A dielectric surface 81 on the semi conductor 78 may be deposited by vapor deposition or other techniques. The dielectric surface 81 is typically porous so that it is capable of receiving fluid coming through the openings 82 and 83 in the conductive leg 71 to cool the surface 81. The layers of this device essentially comprise a series of small switches. It is the sequencing of the switches, and the current to drive these, which creates the heat. The purpose of FIG. 4 is to show one way to cool the switches from a micro-perspective. Although there are many ways to combine different materials to create the switches it is the intent of FIG. 4 to illustrate that the fluid will permeate the materials from which these switches are made. The arrows 84 indicate the direction of the fluid coming in from the base of the semiconductor 78 and migrating through the layer 81. The cooling liquid is in transition to vapor or is the vapor itself depending on the components operating temperature. Again, the key is to have vaporization occur at an exit port near or at the surface of a component for maximum cooling.

Referring to FIG. 5, there is shown a conductor leg 71 having a plurality of passageways 85 formed therein to provide the necessary cooling.

Figure 6:
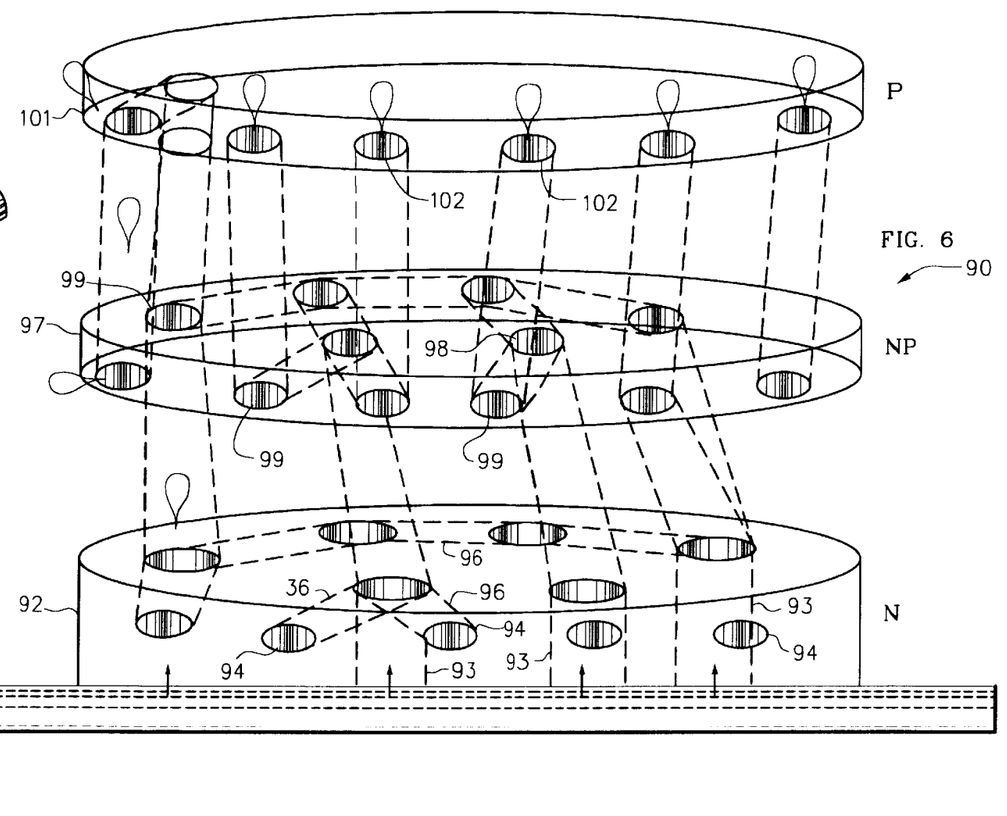
FIG. 6 is an enlarged exploded view of a silicon controlled rectifier modified and cooled in accordance with the subject invention.

Referring to FIG. 6, there is shown an illustration of a high power internally injected silicone rectifier generally designated as 90. The silicone rectifier is mounted to an intake manifold represented as 91. Typically, this rectifier has a negative or N component 92 in which there are formed a plurality of intake ports 93. A plurality of exhaust ports are formed in the negative material at 94. The intake ports 93 and exhaust ports 94 are inner connected by passages 96. The semi conductor layer 97 also has a plurality of intake ports 98 which connect to a plurality of exit ports 99. The semi conductor portion 97 has a conductive, or P component, of the silicone rectifier 101 which has a plurality of passages for intake ports 102 inner connecting with the passages 98 in the semi conductor portion 97. The assembled layers 92, 97 and 101 represents a fully perforated and internally injected silicone control rectifier.

These may be operated individually, in a bank, or as a portion of an integrated power supply within an enclosure with liquid cooling being supplied through the intake manifold 91 and being recycled through the enclosure.

Figure 7:
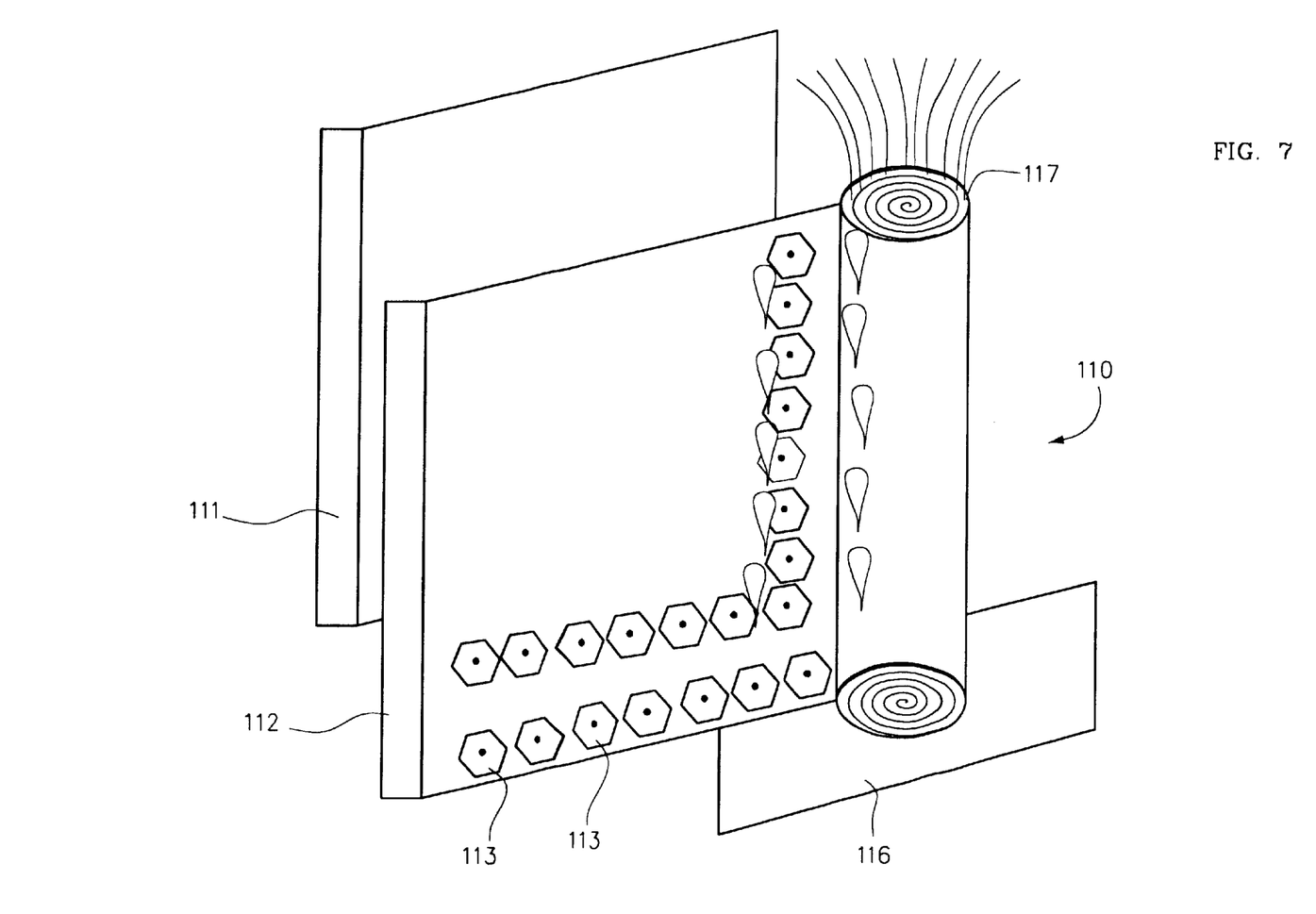
FIG. 7 is an exploded view of a capacitor modified and cooled in accordance with the subject invention.

Referring to FIG. 7, there is shown an internally injected capacitor generally designated as 110. The capacitor is wound with two layers, a conductive layer 111 and a dielectric layer 112. It is important to note that either the surface of the dielectric layer or conductive layer of the capacitor shall have a sufficient gap to allow the migration of cooling fluid between the two. For example, the dielectric layer 112 may be coated with a diamond vapor deposition with a substantially rough surface to provide for the passage of fluid from the base 116 through the capacitor 110 to exit and vaporize at the top 117. The conductor layer 111 may be with scribed or otherwise manufactured with surfaces capable of allowing the passage of fluid from base 116. Furthermore, a rifled surface with channels formed therein may accelerate the flow of cooling liquid through the component. Another way to provide for this gap is the layering of a conductive or non conductive mesh onto either layer 111 or 112 to provide for a passage of fluid.

Although the invention has been described herein with references to specific embodiments, many modifications and variations therein will readily occur to those skilled in the art. Accordingly, all such variations and modifications are included within the intended scope of the invention.

What is claimed is:

1. Apparatus for cooling an electronic component comprising:
    an electronic component having at least one interior passageway formed therein and a plurality of other passageways connecting said interior passageway to the surface of said component;
    means for supplying a cooling fluid capable of phase change under sufficient positive pressure to said interior passageway to conductively cool the interior of the component and to flow through said other passageways to cool the surface of said component at least partially by evaporative cooling; and
    means for collecting and recycling said cooling fluid.

2. Apparatus for cooling an electronic component as set forth in claim 1 including means for controlling the flow rate of said cooling fluid so that at least some of the fluid flowing through said other passageways vaporizes prior to contact with the surface of said component to cool the component through both conductive and evaporative cooling.

3. Apparatus for cooling an electronic component as set forth in claim 1 wherein said electronic component has a fine mesh screen around at least part of the surface thereof to enhance uniform vaporization of the cooling liquid.

4. Apparatus for cooling an electronic component as set forth in claim 1 wherein said component has a plurality of conductive leads, each of said leads having one or more passageways longitudinally and radially therethrough for allowing fluid into the interior of the component.

5. Apparatus for cooling an electronic component as forth in claim 1 wherein said component for cooling is a microprocessor having a plurality set of conductive leads, each of said leads having one or more passageways longitudinally therethrough for allowing cooling fluid into the interior of the microprocessor.

6. Apparatus for cooling an electronic component as set forth in claim 1 wherein said component is a microprocessor having a base, said base having a plurality of passageways within the base which allow for fluid to conductively and evaporatively cool said base.

7. Apparatus for cooling an electronic component as set forth in claim 1 wherein said component is a coil having a core and a plurality of windings, and wherein said internal passageway is longitudinally and radially through said core for allowing cooling fluid into the interior of said coil.

8. Apparatus as set forth in claim 1 wherein said electronic component is a capacitor having at least one conductive layer in contact with at least one dielectric layer and at least one of the said layers has projections formed therein for allowing cooling fluid to flow between the layers.

9. Apparatus as set forth in claim 1 wherein said electronic component is a capacitor having at least one conductive layer in contact with at least one dielectric layer and at least one of said layers has perforations formed therein for allowing cooling fluid to flow between the layers.

10. Apparatus as set forth in claim 1 wherein said electronic component is a capacitor having at least one conductive layer in contact with at least one dielectric layer and at least one of said layers has channels formed therein for allowing cooling fluid to flow between the layers and out through said component in vapor form.

11. Apparatus as set forth in claim 1 wherein said electronic component is a capacitor having at least one conductive layer and at least one dielectric layer comprising a mesh layer between said conductive layer and said dielectric layer for allowing cooling fluid to flow between the layers.

12. Apparatus as set forth in claim 1 wherein said electronic component is a silicone rectifier having a plurality of conductive and semiconductive layers, said layers each having a plurality of internal passageways therein connecting with a plurality of passageways terminating at the surface of the rectifier.

13. A system for cooling an integrated circuit board and its components comprising:

an integrated circuit board having a plurality of passageways formed therein;

at least one component having an internal passageway formed therein to communicate with a passageway in the integrated circuit board, said component having a plurality of other passageways connecting said internal passageway to the surface of said component;

means for supplying a cooling fluid capable of phase change (a) to said passageways in said integrated circuit board to conductively cool said integrated circuit board, (b) to said internal passageway in said component to conductively cool the interior of said component, and (c) to said other passageways in said component; and means for atomizing some of the fluid passing through the other passageways in said component to at least partially cool the surface of the component by evaporative cooling.

14. A system as set forth in claim 13 wherein said means for atomizing comprises a fine mesh screen surrounding the surface of said component.

15. A system as set forth in claim 13 wherein said means for atomizing comprises a nozzle.

16. A system as set forth in claim 13 comprising means for at least partially atomizing the fluid passing through said passageways in the integrated circuit board to cool the integrated circuit board at least partially by evaporative cooling.

17. A system as set forth in claim 13 wherein said means for supplying a cooling fluid comprises a fluid filled manifold mounted to the bottom of said integrated circuit board.

18. A system as set forth in claim 13 comprising:

two integrated circuit boards positioned back to back; and a fluid sealed manifold positioned therebetween.

19. A system for cooling an integrated circuit board as set forth in claim 13 wherein the surface of the component is partially cooled by conductive cooling.

20. A system for cooling an integrated circuit board as set forth in claim 13 comprising means for collecting and recycling said cooling fluid.

21. A method for cooling an electronic component comprising:

providing an internal passageway in the component;

providing a plurality of other passageways in the component connecting the internal passageway to the surface of the component; and supplying a cooling fluid capable of phase change under sufficient pressure to said internal passageway to conductively cool the interior of the component and to at least partially evaporatively cool the surface of said component.

22. A method for cooling an electronic component as set forth in claim 21 comprising collecting and recycling the cooling fluid.

23. A method for cooling an electronic component as set forth in claim 21 comprising:

atomizing at least some of the cooling fluid passing through the other passageways.

24. A method for cooling an electronic component as set forth in claim 21 wherein said electronic component is a coil having a core and a plurality of windings on the core, wherein said internal passageway is longitudinally through said core, and comprising atomizing at least partially the liquid flowing through the other passageways.

25. A method of cooling a plurality of electronic components attached to a circuit board comprising:

passing a cooling fluid capable of phase change under positive pressure internally through each of said components; and controlling the flow rate of said cooling fluid so that at least some of the cooling fluid vaporizes before it reaches the surfaces of the components.

26. A method for cooling a plurality of electronic components as set forth in claim 25 comprising:

collecting and recycling the cooling fluid.

* * * * *